United States Patent
Takahashi

(10) Patent No.: US 7,680,161 B2
(45) Date of Patent: Mar. 16, 2010

(54) TEMPERATURE COMPENSATED LASER FOCUSING OPTICS

(75) Inventor: Tohru Takahashi, Saitama Pref. (JP)

(73) Assignee: Optoelectronics Co., Ltd., Saitama Pref. (JP)

( * ) Notice: Subject to any disclaimer, the term of this patent is extended or adjusted under 35 U.S.C. 154(b) by 158 days.

(21) Appl. No.: 11/222,571

(22) Filed: Sep. 9, 2005

(65) Prior Publication Data

US 2007/0071044 A1 Mar. 29, 2007

(51) Int. Cl.
*H01S 3/04* (2006.01)
(52) U.S. Cl. .................. 372/34; 372/36; 372/101; 372/107; 372/108; 257/99; 257/678
(58) Field of Classification Search ............. 372/34, 372/36, 107, 108, 101; 257/99, 678
See application file for complete search history.

(56) References Cited

U.S. PATENT DOCUMENTS

| | | | |
|---|---|---|---|
| 4,165,918 A | 8/1979 | Moreno | |
| 5,048,050 A * | 9/1991 | Komurasaki | 372/101 |
| 5,283,695 A | 2/1994 | Ziph-Schatxberg et al. | |
| 5,313,333 A | 5/1994 | O'Brien et al. | |
| 5,381,438 A * | 1/1995 | Guo et al. | 372/107 |
| 5,448,587 A * | 9/1995 | Huang | 372/107 |
| 5,864,739 A * | 1/1999 | Kaneko et al. | 399/220 |
| 5,878,073 A * | 3/1999 | Wu | 372/108 |
| 6,118,599 A | 9/2000 | Spinali | |
| 6,208,448 B1 * | 3/2001 | Shibata | 359/196.1 |
| 6,304,392 B1 | 10/2001 | Tinti et al. | |
| 7,290,942 B2 * | 11/2007 | Kuhara et al. | 385/88 |
| 2002/0075916 A1 * | 6/2002 | Sato et al. | 372/36 |
| 2004/0252736 A1 * | 12/2004 | Nakayama et al. | 372/36 |

FOREIGN PATENT DOCUMENTS

| | | |
|---|---|---|
| JP | 06-123851 A | 5/1994 |
| JP | 9-116216 * | 5/1997 |
| JP | 2001-308439 A | 11/2001 |
| WO | WO 03/019463 A | 3/2003 |
| WO | 2007/032957 | 3/2007 |

OTHER PUBLICATIONS

International Search Report and Written Opinion, Sep. 23, 2004. ISR of PCT/US06/034529.

* cited by examiner

*Primary Examiner*—Armando Rodriguez
*Assistant Examiner*—Yuanda Zhang
(74) *Attorney, Agent, or Firm*—Kaplan Gilman & Pergament LLP

(57) ABSTRACT

A laser source assembly comprises a laser diode for generating a laser beam and a focusing lens for focusing the light beam. A spacer is provided for keeping the diode and the lens at a predetermined distance, and is made of a material of low expansion coefficient. Preferably, the subassembly constituted of the diode, the spacer and the lens is housed in a case made of another material that may have a higher expansion coefficient. A resilient element is provided to continuously keep the diode and the lens abutting on the opposite ends of the spacer.

26 Claims, 4 Drawing Sheets

TEMPERATURE COMPENSATED LASER FOCUSING OPTICS

BACKGROUND OF THE INVENTION

The present invention relates to symbol reading techniques, and more particularly, to an improved laser source assembly used in a symbol reading device such as a barcode scanner.

As illustrated in FIG. 1, in an existing laser source assembly 100, a laser beam 30a is generated by a laser source such as a laser diode 10 and is then focused by a lens 20 to form a focused laser beam 30b to be projected onto a symbol or barcode (not shown) during a scanning operation. For obtaining a precise scanning result, it is critical to keep the laser source 10 and the focusing lens 20 at a predetermined precise distance so that the laser beam 30a is kept properly focused. Conventionally, to avoid the difficulties in adjusting the distance between the laser diode 10 and the lens 20 to the predetermined value, the laser diode 10 and the lens 20 are mounted (e.g., by tight fit) to an inner wall of a case 40 formed with two shoulders 41 and 42, as illustrated in FIG. 1. In particular, the two shoulders 41, 42 are apart from each other by a longitudinal distance exactly equal to the predetermined distance required between the laser diode 10 and the lens 20. When secured in place, the base 21 of the lens 20 abuts on the shoulder 41 while the base 11 of the laser diode 10 abuts on the shoulder 42, thus being spaced by the predetermined distance. To realize precise configurations, the case 40 is preferably a single die cast piece of a metal alloy such as a Magnesium, Iron, Nickel or Cobalt alloy.

However, when the ambient temperature changes, the case 40 made of the above metal alloys expands or shrinks, causing a change in the distance between the shoulders 41 and 42. This results in a change of the distance between the laser diode 10 and the focusing lens 20, which degrades the precision of the laser source assembly.

SUMMARY OF THE INVENTION

Therefore, it is an object of the present invention to provide an improved laser source assembly in which the focusing precision of the laser beam is less affected by a change in the ambient temperature.

It is a further object to provide an improved laser source assembly in which a laser source and the focusing lens are kept in a predetermined distance regardless of a change in the ambient temperature.

It is a further object to provide an improved laser assembly that is simple in structure and is easy to assemble.

It is a further object to provide a symbol reader in which the laser beam is precisely focused without being affected by a change in the ambient temperature.

According to the present invention, an improved light source assembly is provided which comprises a light source unit for generating a light beam and a focusing lens unit for focusing the light beam. In particular, a spacing element is provided for keeping the two units at a predetermined distance, and is made of a material having a low expansion coefficient. Thus, because the spacing element does not expand or shrink when the ambient temperature changes, the distance between the light source unit and the focusing lens unit is kept in the required distance even when the ambient temperature changes, thereby keeping the light beam being focused precisely. Preferably, the spacing element is made of a super invar material. In a preferred embodiment, the light source unit comprises a laser diode for generating a laser beam.

Preferably, the subassembly constituted of the light source unit, the focusing lens unit and the spacing element is housed in a case made of another material, which may have a higher expansion coefficient. Preferably, the case is made from a magnesium alloy, an iron alloy, a nickel alloy or a cobalt alloy. Preferably, the case is a die cast piece. Preferably, the subassembly is prevented from moving in a longitudinal direction, e.g., by a shoulder formed on an inner wall of the case.

Preferably, the spacing element has a length between two end faces, and a means is provided to keep the light source unit and the focusing lens unit abutting on the two end faces, respectively. Preferably, the two end faces are opposite to each other, and the spacing element is sandwiched between the two units. Preferably, the means comprises a resilient element, such as an O-ring or spring, for continuously applying a force to keep the two units abutting on the two end faces of the spacing element.

Alternatively, the spacing element is in the form of an enclosure for housing the light source unit and the focusing lens unit therein. Preferably, two shoulders are formed on an inner wall of the enclosure, and are apart from each other by the predetermined distance. The light source unit and the focusing lens unit abut on the two shoulders respectively.

BRIEF EXPLANATION OF THE DRAWINGS

The above and other features and advantages will be clearer after reading the detailed description of the preferred embodiments of the present invention with reference to the accompanying drawings, in which.

DETAILED DESCRIPTION OF PREFERRED EMBODIMENT

The preferred embodiments of the present invention are now described in detail, and the similar elements are referenced by the same numerals in all the embodiments. It shall be understood that the exemplary embodiments are not for limiting the scope of the invention.

Figure 1:
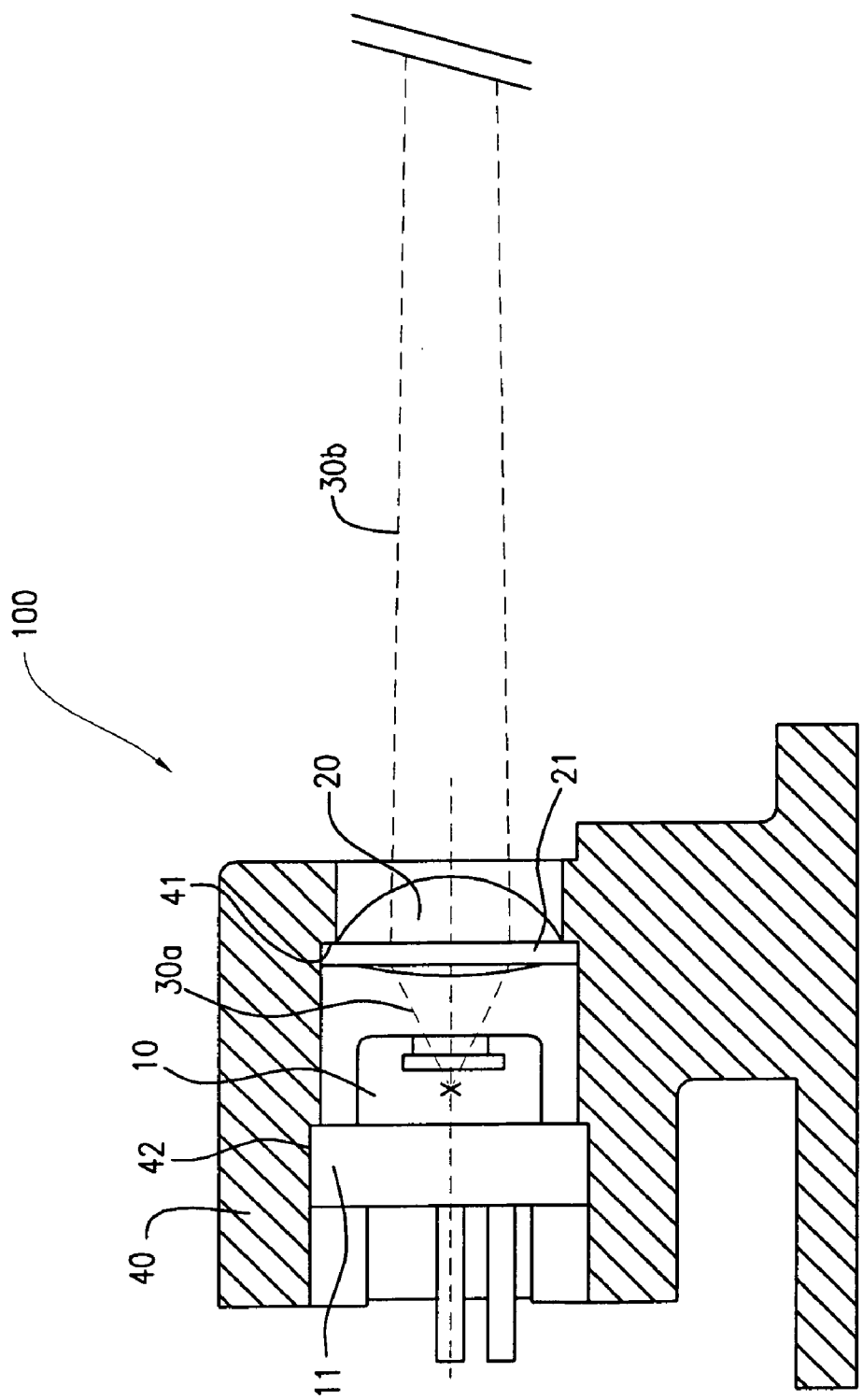
FIG. 1 is a sectional view schematically illustrating a laser source assembly in the prior art.
Figure 2:
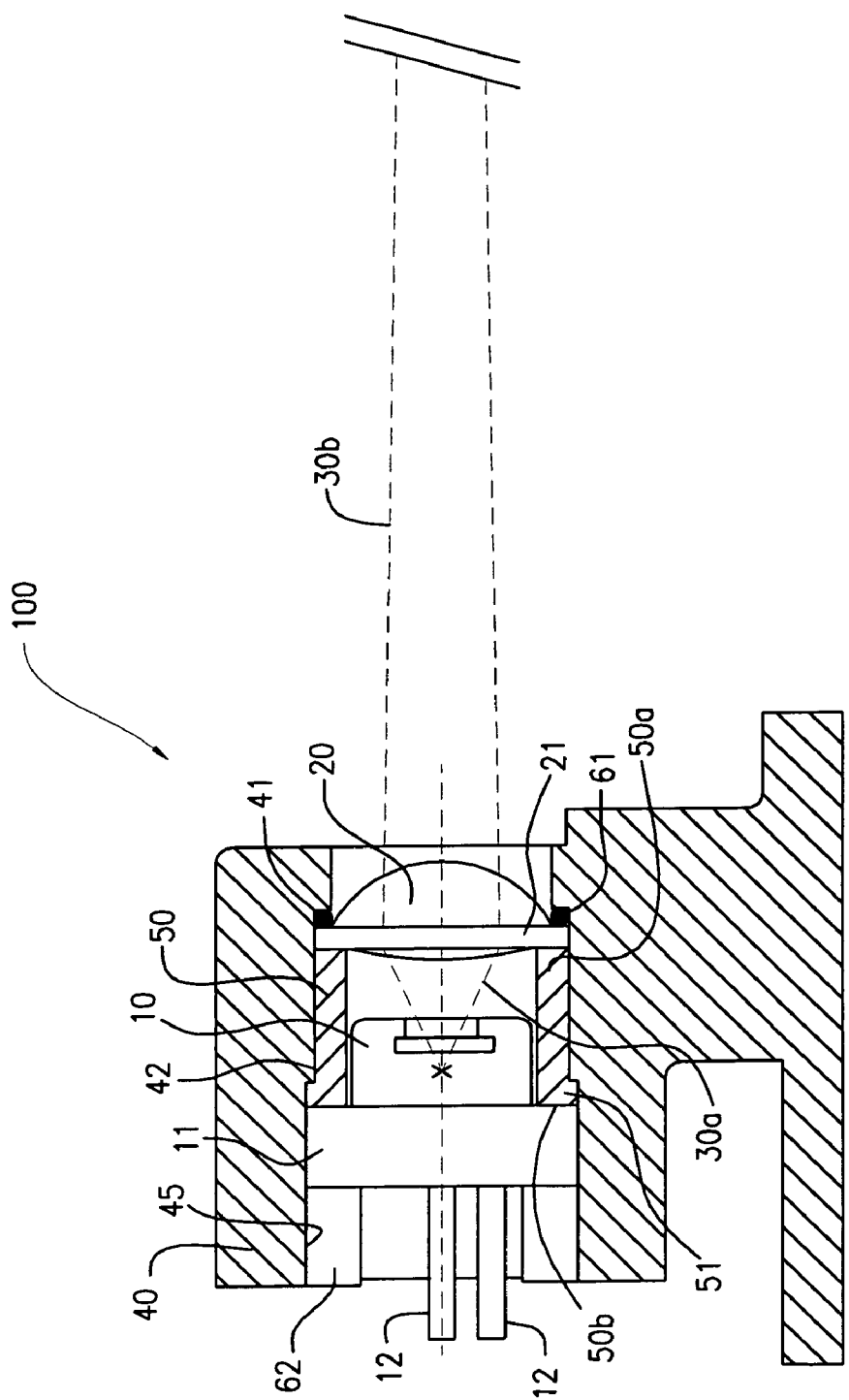
FIG. 2 is a sectional view schematically illustrating a first embodiment of the light source assembly according to the present invention.

FIG. 2 illustrates a first embodiment of the light source assembly according to the present invention, which is applicable in a symbol reading device such as a barcode scanner. Similar to the prior art as illustrated in FIG. 1, the light source assembly 10 generally comprises a light source unit for generating a light beam and a focusing lens unit for focusing the light beam emitted from the light source unit. More specifically, in the embodiment, the light source unit comprises a laser source such as a laser diode 10 connected to a power source (not shown) through electrodes 12 for generating a laser beam 30a, and the focusing lens unit comprises a lens 20 for focusing the laser beam 30a into a focused laser beam 30b. The focused laser beam 30b is projected to a symbol or barcode (not shown) during a scanning operation for reading the barcode. To properly focus the laser beam 30a to obtain a precise scanning result, the laser diode 10 and the lens 20 must be kept in a predetermined distance.

According to the teaching of the present invention, a spacer 50 made of a material having a low expansion coefficient is provided to keep the laser diode 10 and the lens 20 at the predetermined distance. Because the spacer 50 of such material does not expand or shrink significantly when an ambient temperature changes, the distance between the laser diode 10 and the lens 20 is kept unchanged at the predetermined distance even when the ambient temperature changes. Preferably, the spacer 50 is made of a super invar material.

As illustrated in FIG. 2, the spacer 50 is in a form of a generally cylindrical sleeve with a two opposite end faces 50a and 50b. The base 21 of the lens 50 abuts on the end face 50a, and the base 11 of the laser diode 10 abuts on the end face 50b, thereby sandwiching the spacer 50 therebetween. The spacer 50 has a length between the two end faces 50a, 50b equal to the required predetermined distance, thereby keeping the laser diode 10 and the lens 20 apart from each other by the predetermined distance.

As illustrated in FIG. 2, the laser diode 10, the spacer 50 and the lens 20 constitute a subassembly, and are housed in a case 40. Preferably, the case 40 is made of a material different from that of the spacer 50, which may have a higher expansion coefficient and therefore a lower cost than the material of the spacer 50. For example, the case 40 may be made of a magnesium alloy, an iron alloy, a nickel alloy, a cobalt alloy, etc. Preferably, the case 40 is a die cast piece.

Preferably the subassembly is prevented from moving inside the case 40 in one longitudinal direction. In the embodiment shown in FIG. 2, an inner wall 45 of the case 40 is formed with a shoulder 42 which engages with a flange 51 formed at the end face 50b of the spacer 50, thereby preventing the spacer 50 and therefore preventing the whole subassembly from moving to the right relative to the case 40.

A resilient element, such as an O-ring 41, is provided to continuously apply a longitudinal force onto the base 21 of the lens 20, thereby keeping the base 21 abutting on the end face 50a, as well as keeping the end face 50b abutting on the base 11 of the laser diode 10. Preferably the O-ring 41 is compressed between a shoulder 41 formed on the inner wall 45 of the case 40 and the base 21 of the lens 20.

Preferably a retainer 62, which may be in the form of a cylindrical sleeve, is provided to retain the subassembly in place inside the case 40. The retainer 62 abuts on the base 11 of the laser diode 10 to prevent the subassembly from leaving the case 40. The retainer 62 may be secured to the inner wall 45 of the case 40 by a proper manner such as tight fit, threaded engagement, or the like.

To assemble the components, the O-ring 41 is first placed on the shoulder 41 of the case 40, and then the lens 20, the spacer 50 and the laser diode 10 are consequently placed inside the case 40, with the base 21 of the lens 20 abutting on the O-ring 41. Finally, the retainer 62 is inserted into the case 40 and presses on the base 11 of the laser diode 10.

When all the components are in place, the O-ring 41 is in a compressed state, thereby continuously applying a force in a direction to the left onto the base 21 of the lens 20, and pressing the base 21 of the lens 20, the spacer 50 and the base 11 of the laser diode 10 in a tight contact with one another. Thus, the distance between the base 21 of the lens 20 and the base 11 of the laser diode 10 is continuously kept at the required distance is determined by the length of the spacer 50. As explained above, since the spacer 50 is made of a material having a low expansion coefficient, the length of the spacer 50 does not change significantly when the ambient temperature changes, thus keeping the distance between the bases 11 and 21 unchanged as long as they are kept abutting on the end faces 50a, 50b of the spacer 50.

When the ambient temperature increases, the case 40 expands, and therefore the longitudinal dimension of the case 10 increases. Because the spacer 50 does not expand, the increase in longitudinal dimension of the case 40 leaves a small room for the subassembly components to get loose. However, as long as the increase is not large enough to relieve the O-ring 41 from the compressed state, the base 21 of the lens 20 is kept bearing the resilient force from the O-ring 41. This keeps base 21 of the lens 20, the spacer 50 and the base 11 of the laser diode 10 in close contact with one another, and thus keeps the bases 11 and 21 in the predetermined distance equal to the length of the spacer 50.

When the ambient temperature decreases, the case 40 shrinks and therefore the O-ring 41 is compressed more, forcing the components of the subassembly in tighter contact with one another. It is noted that the flange 51 of the spacer 50 sandwiched between the base 11 of the laser diode 10 and the shoulder 42 of the case 40 may suffer stress caused by the shrinking of the case 40. To alleviate this problem, it is advantageous to leave a small space between the base 11 and the shoulder 42 for the flange 51 at the normal ambient temperature, instead of tightly squeezing the base 11 onto the spacer 50.

It can be noted that the structure of the case 40 in FIG. 2 is substantially the same as that in the prior art shown in FIG. 1. Therefore, it can be appreciated that the embodiment shown in FIG. 2 does not require a change to the structure of the existing case 40.

Figure 3:
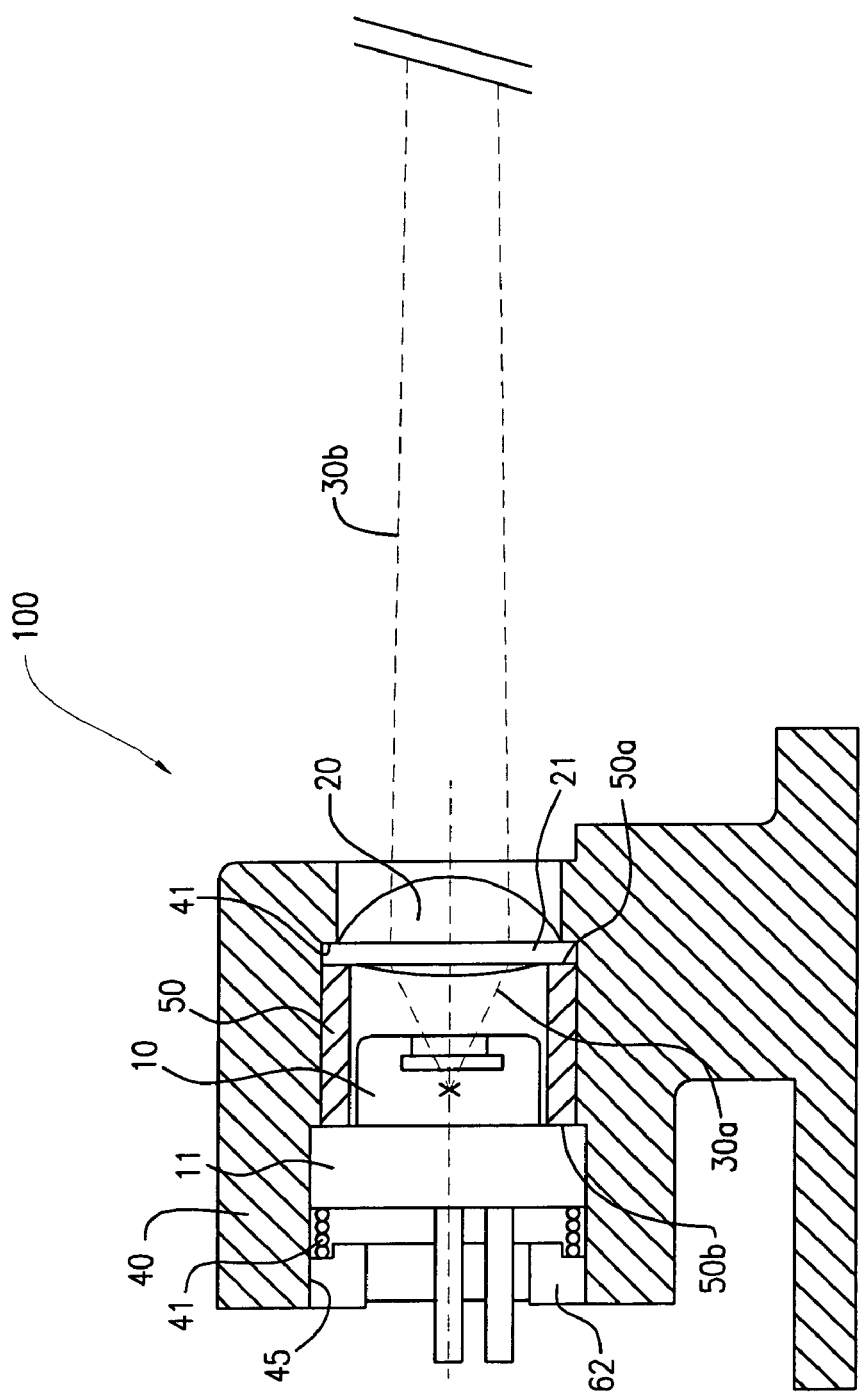
FIG. 3 is a sectional view schematically illustrating a second embodiment of the light source assembly according to the present invention.

FIG. 3 illustrates a second embodiment of the light source assembly according to the present invention. In this embodiment, the base 11 of the laser diode 10 and the base 21 of the lens 20 are substantially of the same radial dimension. Preferably, the spacer 50 is in the form of a simple cylindrical sleeve with a consistent thickness, and there is no flange 51 as in the first embodiment. The inner wall 45 of the case 40 forms a generally cylindrical chamber of a constant diameter, except that a shoulder 41 is formed at an end of the chamber. It can be appreciated that the simple structures in the case 40 and the spacer 50 in this embodiment are advantageous in lowering manufacturing cost. Preferably, the spacer 50 is made of a material having a low expansion coefficient, while the case 40 is made of a different material that may have a higher expansion coefficient. Preferably, the spacer 50 is made of a super invar material, while the case 40 is made of a magnesium alloy, an iron alloy, a nickel alloy, a cobalt alloy, or the like.

The base 21 of the lens 20 rests directly on the shoulder 41, thereby preventing the subassembly from moving to the right relative to the case 40. A compressed coil spring 41 is provided to continuously apply a force onto the base 11 of the laser diode 11 in a longitudinal direction to the right, thereby keeping the subassembly against the shoulder 41, as well as keeping the base 11 of the laser diode 10, the spacer 50 and the base 21 of the lens 20 abutting one another. Thus, the distance between the bases 11 and 21 determined by the length of the spacer 50 is kept at the required value that is equal to the length of the spacer 50.

A retainer 62 is provided to retain the coil spring 41 and the subassembly constituted of the laser diode 10, the spacer 50 and the lens 20 in place. The retainer 62 may be secured to the inner wall 45 of the case 40 by proper manner such as tight fit, threaded connection, etc.

When the ambient temperature increases, the case 40 expands, which leaves more room to the subassembly housed therein. This may loosen the diode 10, spacer 50 and the lens 20 from the close contact with one another. However, as long as the coil spring 41 is in a compressed state, the force from the spring 41 still keeps the components of the subassembly abutting one another.

When the ambient temperature decreases, the case 40 shrinks. The coil spring 41 is compressed more, thus increasing the force applied on the base 11 and keeping the components of the subassembly in tighter contact with one another.

Figure 4:
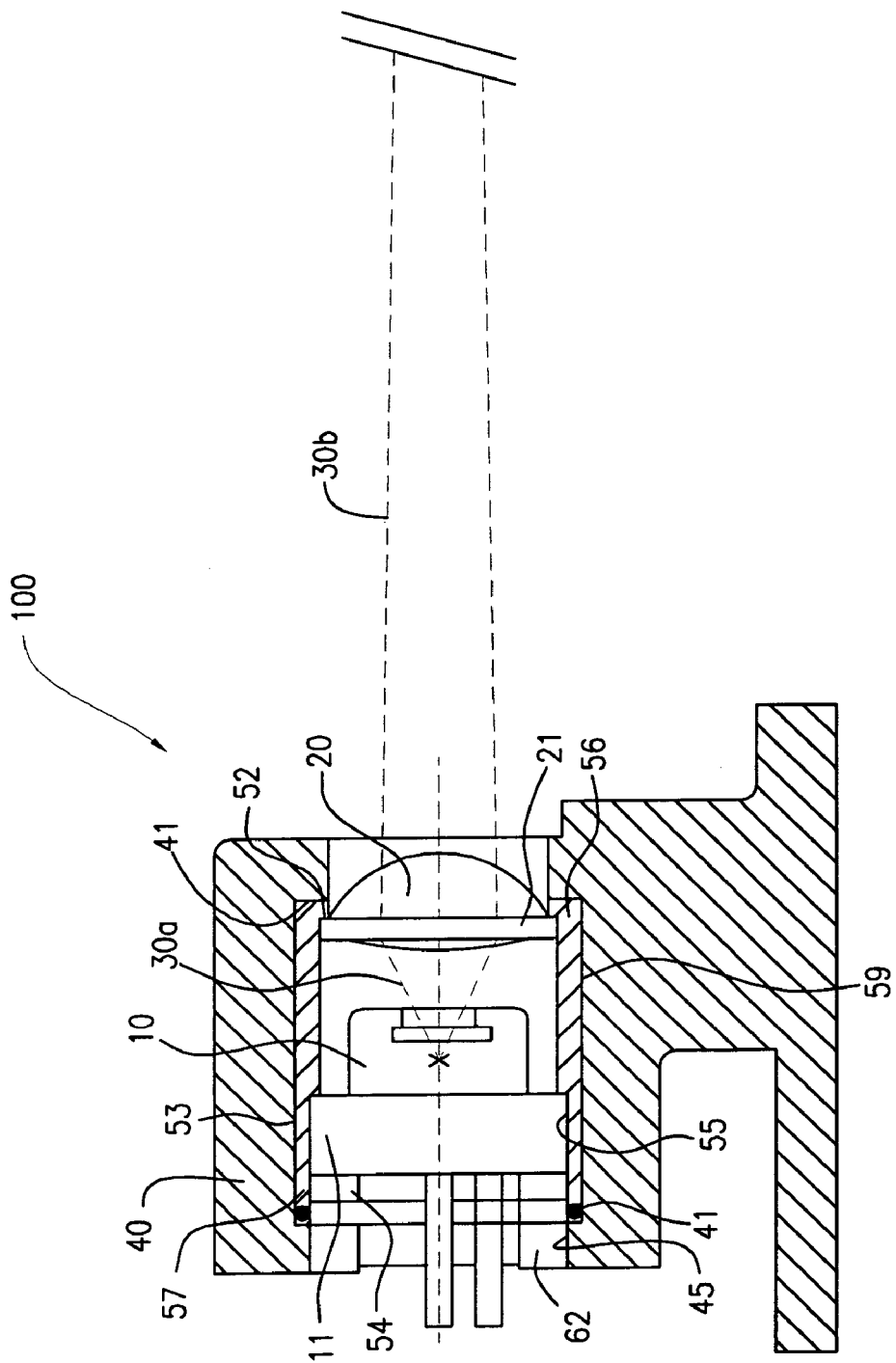
FIG. 4 is a sectional view schematically illustrating a third embodiment of the light source assembly according to the present invention.

FIG. 4 illustrates a third embodiment of the light source assembly according to the present invention. In this embodiment, the spacer 50, which is preferably made of a material having a low expansion coefficient, is formed with an inner wall 55 that is similar to the inner wall 45 of the case 40 as in the prior art shown in FIG. 1. Preferably, the spacer 50 is made of a super invar material.

More specifically, the spacer 50 is of a generally cylindrical sleeve with two shoulders 52 and 53 formed on the inner wall 55. The base 21 of the lens 20 engages with the inner wall 55, e.g., by tight fit, and abuts on the shoulder 52. The base 11 of the laser diode 10 may engage with the inner wall 55 of the spacer 50 in a similar manner and abuts on the shoulder 53. Alternatively, the base 11 may be kept abutting on the shoulder 53 by a retainer 54 that may be secured to the inner wall 55 of the spacer 50, e.g., by threaded engagement, tight fit, etc. The distance between the two shoulders 52, 53 determines the distance between the bases 11, 21, thereby keeping the distance between the laser diode 10 and the lens 20 in the required value.

The spacer 50, with the laser diode 10 and the lens 20 installed therein, is housed in a case 40. The case 40 is made of a different material that may have a higher expansion coefficient, such as an magnesium alloy, an iron alloy, a nickel alloy, a cobalt alloy, etc. A shoulder 41 is formed in the inner wall 45 of the case 40 for abutting an end 56 of the spacer 50, thereby preventing the spacer 50 from moving to the right.

An O-ring 41 is compressed between an opposite end 57 of the spacer 50 and a retainer 62 secured to the inner wall 45 of the case 40, thereby keeping the spacer 50 in place inside the case 40. This allows a slight relative placement between the inner wall 45 of the case and an outer inner wall 59 of the spacer 50 when the case 40 expands or shrinks due to a change in the ambient temperature.

Because the laser diode 10 and the focusing lens 20 are mounted to the inner wall 55 of the spacer 50 that does not expand or shrink when ambient temperature changes, the distance between the laser diode 10 and the lens 20 remains unchanged when the ambient temperature changes.

Though the above has described the preferred embodiments of the present invention, it shall be understood that numerous adaptations, modifications and variations are possible to those skilled in the art without departing the gist of the present invention. For example, the spacer 50 does not need to be an integral cylindrical sleeve, but may comprises one or more separate elongate bars, thus saving the expensive super invar material as well as saving the manufacturing cost because of the simple configuration. Therefore, the scope of the present invention is solely intended to be defined by the accompanying claims.

What is claimed is:

1. A laser source assembly, comprising:
   a housing having an interior space with a length extending between first and second ends, said housing being made of a first material;
   a first unit comprising a focusing lens mounted within said interior space near said first end;
   a second unit comprising a source of laser light mounted within said interior space in spaced relationship to said first unit;
   a spacer mounted within said space so as to extend between said first and second units and engaging both units so as to prevent relative lengthwise movement therebetween, said spacer being made of a second material having a lower coefficient of expansion than said first material;
   wherein an outer surface of the spacer and an inner wall surface of the housing are concentric over at least a part the length of the housing including the length segment extending from the first unit to the second unit;
   a resilient element mounted in said housing so as to exert a lengthwise force on said spacer, urging it towards one of said first and second ends;
   said housing being a case having a chamber formed by an inner wall for housing a subassembly constituted of said two units and said spacer therein; and
   a second means for preventing said subassembly from moving relative to said case in a first longitudinal direction, comprising a shoulder formed on said inner wall of said case and a lateral protrusion formed on said spacer for engaging with said shoulder, thereby preventing said spacer from moving relative to said case in said first longitudinal direction.

2. The laser source assembly of claim 1, wherein said housing contains sections having plural different diameters.

3. The laser source assembly of claim 1, wherein said resilient element comprises a compressed spring.

4. The laser source assembly of claim 1, wherein said resilient element comprises an O-ring.

5. The laser source assembly of claim 1, wherein said housing comprises a case having a chamber formed by an inner wall for housing a subassembly constituted of said two units and said spacer therein.

6. The laser source assembly of claim 1, wherein said resilient element continually applies a force on said first unit in a second longitudinal direction opposite to said first longitudinal direction, thereby keeping said first unit abutting on a first end face of said spacer, as well as keeping a second end face of said spacer abutting on said second unit.

7. The laser source assembly of claim 6, wherein said inner wall of said case is formed with another shoulder, and said resilient element is compressively placed between said another shoulder of said case and said first unit.

8. The laser source assembly of claim 7, wherein said resilient element comprises an O-ring.

9. The laser source assembly of claim 6, wherein said second means further comprises a retainer for preventing said second unit from moving relative to said case in said second longitudinal direction.

10. The laser source assembly of claim 9, wherein said retainer is secured to said inner wall of said case.

11. The laser source assembly of claim 6, wherein said lateral protrusion of said spacer is a flange formed at an end forming said second end face.

12. The laser source assembly of claim 1, wherein said first means is adapted to continuously apply a force on said second unit in said first longitudinal direction, thereby keeping said second unit abutting on said spacer, keeping said spacer abutting on said first unit, as well as keeping said first unit abutting on said shoulder of said case.

13. The laser source assembly of claim 12, wherein said resilient element is a compressed spring coil.

14. The laser source assembly of claim 12, wherein said spacer has a constant lateral dimension through said length.

15. The laser source assembly of claim 1, wherein said spacer comprises a chamber having an inner wall at least partially housing at least one of said two units therein, and a housed unit is secured to said inner wall of said spacer.

16. The laser source assembly of claim 15, wherein said inner wall of said spacer is formed with two stepped shoulders apart from each other by said predetermined distance, and said two units abut on said two shoulders respectively.

17. The laser source assembly of claim 1, wherein said case comprises an inner wall formed with a shoulder, and further comprising a resilient element for continuously applying a longitudinal force for keeping said spacer abutting on said inner wall.

18. The laser source assembly of claim 1, wherein said spacer is made of a super invar material.

19. The laser source assembly of claim 5, wherein said spacer is made of a super invar material, and said case is made of a magnesium alloy, an iron alloy, a nickel alloy or a cobalt alloy.

20. The laser source assembly of claim 1 wherein said resilient means acts directly on said spacer.

21. The laser source assembly of claim 2 wherein said resilient means acts through one of said first and second units, urging the spacer into the other of said first and second units.

22. A laser source assembly, comprising:
a housing having an interior space with a length extending between first and second ends of the housing, the housing being made of a first material, the housing having an inner wall defining the interior space;
a lens mounted within the interior space of the housing near the first end thereof;
a second unit comprising a source of laser light mounted within said space in spaced relationship to said first unit; and
a source of laser light mounted within the interior space of the housing; and
a spacer mounted within said interior space so as to extend between the lens and the laser light source and engaging both units so as to retain the relative lengthwise spacing of the lends and the laser light source, said spacer being made of a second material having a lower coefficient of expansion than said first material; and
wherein an outer surface of the spacer and the inner wall of the housing are concentric over a portion of the length of the housing including at least a distance between the lens and the laser light source;
wherein the outer surface of the spacer engages the inner wall of the housing over at least a majority of the length of the spacer.

23. The laser source assembly of claim 22 wherein the inner space of the housing defined by the inner wall thereof has a substantially consistent cross-sectional geometry along a longitudinal axis of the housing.

24. The laser source assembly of claim 22 wherein the inner space of the housing defined by the inner wall thereof is substantially cylindrical.

25. The laser source assembly of claim 22 wherein the external surface of the spacer and the inner wall of the housing are both cylindrical.

26. The laser source assembly of claim 22 wherein the outer surface of the spacer engages the inner wall of the housing over substantially all of the length of the spacer.

* * * * *